(12) United States Patent
Gustaveson, II

(10) Patent No.: US 6,977,341 B1
(45) Date of Patent: Dec. 20, 2005

(54) APPARATUS FOR UTILITY OUTLET CONTROL

(76) Inventor: Ronald Glen Gustaveson, II, 332 W. 13130 S., Draper, UT (US) 84020

( * ) Notice: Subject to any disclaimer, the term of this patent is extended or adjusted under 35 U.S.C. 154(b) by 0 days.

(21) Appl. No.: 10/915,654

(22) Filed: Aug. 10, 2004

(51) Int. Cl.⁷ .............................................. H05K 5/03
(52) U.S. Cl. ........................ 174/66; 174/67; 194/247; 194/285; 220/241; 220/242
(58) Field of Search .................. 174/66, 67; 220/3.8, 220/241, 242; D13/153; 194/247, 282–286, 194/353

(56) References Cited

U.S. PATENT DOCUMENTS

| | | | |
|---|---|---|---|
| 2,818,991 A * | 1/1958 | Hess ........................... | 220/242 |
| 3,068,442 A * | 12/1962 | Kubik et al. ................. | 220/242 |
| 3,677,434 A * | 7/1972 | Boyer ......................... | 220/3.8 |
| 4,228,317 A * | 10/1980 | Cziment ....................... | 174/67 |
| 4,733,017 A * | 3/1988 | Wolfe-Taylor et al. ....... | 174/67 |
| 4,924,994 A | 5/1990 | Pinsson | |
| 5,421,445 A | 6/1995 | Alvarez Mata | |
| 5,912,432 A * | 6/1999 | Thomas ....................... | 174/67 |
| 6,545,218 B1 * | 4/2003 | Blaess ......................... | 174/67 |
| 6,796,814 B1 * | 9/2004 | Handschke .................. | 174/67 |
| 6,805,580 B2 * | 10/2004 | Piedmont ..................... | 174/66 |
| 6,817,873 B1 * | 11/2004 | Gorman ....................... | 174/66 |
| 6,832,921 B1 * | 12/2004 | Stewart ....................... | 174/66 |
| 6,840,800 B2 * | 1/2005 | Kidman ....................... | 174/66 |

* cited by examiner

Primary Examiner—Dean A. Reichard
Assistant Examiner—Adolfo Nino

(57) ABSTRACT

A device for utility outlet control is provided that includes means for selectively blocking access to a utility outlet by way of disengaging or engaging the outlet blocking means. The outlet is blocked from access when the outlet is not being used. A user may gain access to the outlet upon appropriate payment or by an authorized access key. Typical utility outlets controllable by the present invention include, but are not limited to electric utility outlets, telephone utility outlets, and Internet access utility outlets.

5 Claims, 3 Drawing Sheets

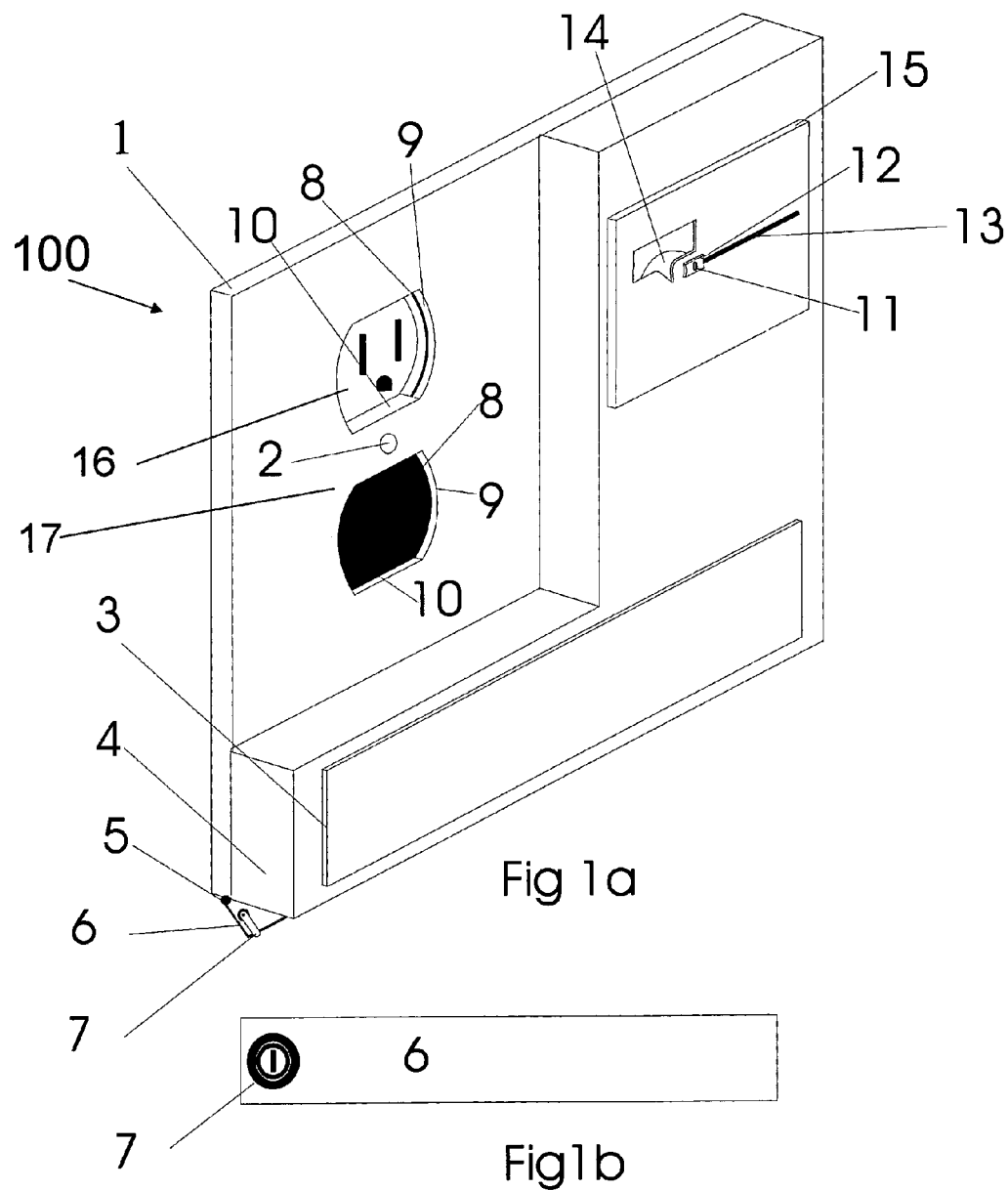

APPARATUS FOR UTILITY OUTLET CONTROL

FIELD OF THE INVENTION

The present invention relates generally to utility outlet covers. More particularly, the invention relates to utility outlet covers which block unauthorized access by the public unless.

BACKGROUND OF THE INVENTION

In the past, commercial locations have had primarily two choices with respect to covering accessible utility outlets. A first conventional approach is the conventional faceplate. Faceplates are a particular problem when city codes require the placement of utility outlets (e.g., electrical outlets) in a commercial setting (e.g., accessible to the public) at least because it places a burden on commercial entities to pay for a utility service usage that they did not authorize. That is, conventional faceplates allow anyone to plug into a utility outlet and utilize the available utility. Typical utilities that experience this issue include electricity, phone, and Internet utility services. Most cities provide legal code for how many electrical outlets there need to be in a commercial location and how far apart they should be. However, when it comes to internet (e.g., RJ 45) and phone (e.g., RJ 6) outlets, there, typically, are no regulations; thus, it is relatively easy for commercial entities to block unauthorized access.

A second conventional approach to covering publicly accessible utility outlets is to use a blank faceplate. On occasion commercial locations will place a blank faceplate to cover the outlet to practically block public use. However, these blank faceplates make accessibility difficult for authorized us as well, e.g., housekeeping and maintenance workers.

In view of the foregoing, there is a need for improved techniques for to make publicly accessible utility outlets only available to authorized users. It would further be desirable if the authorization technique also allowed public use that financially benefits the utility outlet owner.

BRIEF DESCRIPTION OF THE DRAWINGS

The present invention is illustrated by way of example, and not by way of limitation, in the figures of the accompanying drawings and in which like reference numerals refer to similar elements and in which:

FIG. 1a illustrates a front perspective view of an exemplary a vending faceplate in accordance with an electrical outlet embodiment of the present invention;

FIG. 1b illustrates a bottom view of vending faceplate, showing a bottom view of the coin access door of FIG. 1a;

Figure 2A:
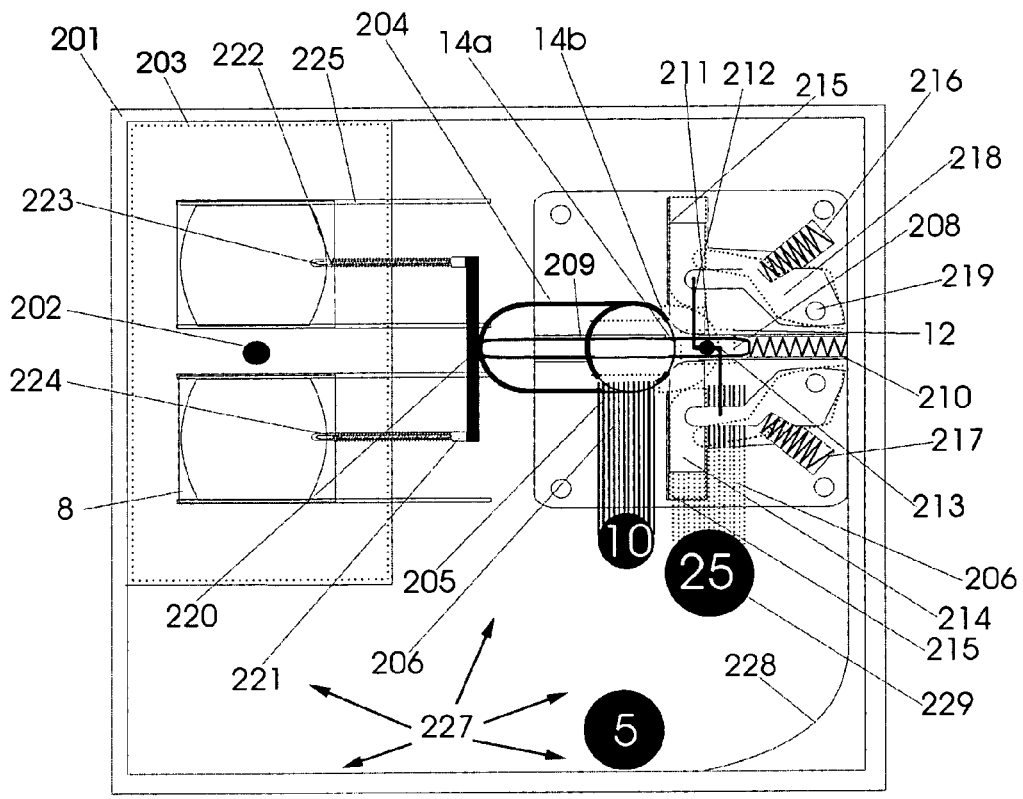
FIG. 2a illustrates an exemplary mechanism within vending faceplate 100 of FIG. 1a to carry out the foregoing principles, in accordance with an embodiment of the present invention; and, FIG. 2b illustrates is the same embodiment as in FIG. 2a with a conventional electric plug inserted during normal operation.

Unless otherwise indicated illustrations in the figures are not necessarily drawn to scale.

SUMMARY OF THE INVENTION

To achieve the forgoing and other objects and in accordance with the purpose of the invention, a device for utility outlet control is provided that includes means for selectively blocking access to a utility outlet by way of disengaging or engaging the outlet blocking means. The outlet is blocked from access when the outlet is not being used. A user may gain access to the outlet upon appropriate payment or by an authorized access key. Typical utility outlets controllable by the present invention include, but are not limited to electric utility outlets, telephone utility outlets, and Internet access utility outlets.

Other features, advantages, and object of the present invention will become more apparent and be more readily understood from the following detailed description, which should be read in conjunction with the accompanying drawings.

DETAILED DESCRIPTION OF THE PREFERRED EMBODIMENTS

The present invention is best understood by reference to the detailed figures and description set forth herein.

Embodiments of the invention are discussed below with reference to the Figures. However, those skilled in the art will readily appreciate that the detailed description given herein with respect to these figures is for explanatory purposes as the invention extends beyond these limited embodiments. In particular, the embodiment shown is directed to adapting a conventional electrical outlet according below teachings, however those skilled in the art will further readily appreciate that these teachings may be equivalently applied to a multiplicity of other kinds of outlets, including but not limited to, electrical, phone and Internet jacks.

FIG. 1a illustrates a front perspective view of an exemplary vending faceplate 100 in accordance with an electrical outlet embodiment of the present invention. Vending faceplate 100 is configured to suitably replace a conventional outlet faceplate, and enables electrical outlets to be locked by way of a removable cover until currency is deposited, allowing temporary access. Vending faceplate 100 fits around an outlet similar to a conventional faceplate and extends beyond to accommodate the added mechanics required to implement the vending aspect of the present invention. Vending faceplate 100 may be manufactured by known mold-injection techniques and tooled for mass production. There is a coin receptacle 14 where coins are deposited; a retraction knob 12 which, when moved, opens a retractable outlet cover 8, made, for example, of a hard plastic, unveiling an electrical outlet, thus making it accessible to the user until the plug is removed and cover the is slid back over the outlet through the use of springs inside vending faceplate 100. Those skilled in the art will recognize a similar implementation suitable for other utility outlets such as phone and Internet jacks. Vending faceplate 100 comprises a coin storage area 4 where the coins are stored where an optional clear plastic sleeve 3 in the front for advertisement insertion may be placed. Coin storage area 4 may be made of any suitable material—in the present embodiment, it is same material as faceplate frame. Vending faceplate 100 may be secured to the outlet/wall according to known techniques, such as with a hex screw, as well as, sealed to the wall with caulking/silicone to make it more tamper-proof.

Vending faceplate 100 has two access points accessible only by two different keys. The first key access, knob lock 11, is located on the retraction knob 12 on the front of vending faceplate 100. When inserted into the top of the retraction knob 12, this key enables maintenance/housekeeping to slide outlet cover open without having to deposit any coins. The second key access is a door lock 7 located on the hinge door at the bottom for collecting coins/revenue.

Vending faceplate 100 comprises the following elements as shown in the Figure:
- An outside frame 1
- A hex machine-screw 2 that attaches vending faceplate 100 to the outlet/wall
- Clear, plastic sleeve 3 where advertisements may be inserted.
- Coin storage area 4
- A hinge 5 that allows a coin access door 6 to open, which holds coins in coin storage area 4.
- Door lock 7 that locks coin access door 6 to coin storage area 4.
- Retractable outlet cover 8
- A back faceplate that securely fits around a conventional outlet (partially visible).
- A guide rail 10 for retractable outlet cover 8
- Knob lock for maintenance/housekeeping to gain access to vending faceplate 100 by releasing retraction knob 12, which slides to the right thereby exposing the conventional outlet.
- A retraction slide rail 13 opening that guides the movement of retraction knob 12.
- Coin receptacle 14 where a coin(s) is placed.
- Mechanical cover 15, which covers a portion of the vending mechanism.
- Forward faceplate 17.

FIG. 1*b* illustrates a bottom view of vending faceplate 100, showing a bottom view of coin access door 6 of FIG. 1*a*, and an outside view of lock 7.

The vending control mechanism may be implemented according to known techniques. In some embodiments, coin operated vending dispensers such as that used in conventional gumball machines or street parking meters may be readily adapted by those skilled in the art to achieve the teachings of the present invention. A suitable coin operated vending dispenser mechanism would properly receive a coin in the slot and then automatically or upon turning a knob, access to the utility or service being vended is enabled.

The operation and structure of the embodiment of FIG. 1 will now be described is some detail. The base of outside frame 1 is thicker in depth than the conventional outlet faceplate in order to create a back faceplate 9 deep enough to allow outlet cover 8 to move along guide rail 10. When retractable outlet cover 8 moves to the right along guide rail 10, it opens up temporary access to electrical outlet 16. Hex screw 2 secures the forward faceplates 17 and back faceplate 9 to the outlet/wall. Back faceplate 9 molds around outlet providing additional stability for vending faceplate 100. Forward faceplate 17 is separated from the back faceplate 9 by rails 10, providing space for retractable outlet cover 8 to slide. Clear, adhesive silicone may also be applied along the outside of vending faceplate 100 to provide additional support and tamper-resistance if desired. In addition to the mechanical design of vending faceplate 100, a clear, plastic sleeve 3 may be attached onto any suitable location on vending faceplate 100, such as on coin storage area 4 in the present embodiment, for advertisements and/or instructions to be placed and easily changed. Other embodiments may not include plastic sleeve 3 or any kind of affixed indicia.

A coin(s) must be deposited into coin receptacle 14 in order to release the retraction knob 12 which then slides to the right along retraction slide rail 13 simultaneously moving retractable outlet cover 8 and exposing electrical outlet 16. While retraction knob 12 is held/slid all the way to the right, a plug (230 in FIG. 2*b*) must be inserted into electrical outlet 16; otherwise, retractable outlet cover 8 will spring back to its original state. Retraction knob 12 can also be released, by a specific key inserted into the knob lock 11 on the top of the retraction knob 12. This key is necessary for maintenance and housekeeping to have, in so that they can access the outlets without having to pay.

Coin storage area 4 allows for several coins to be stored. Attached to the bottom of vending faceplate 100 is coin access door 6 that is attached to coin storage 4 by hinge 5 and is locked into place by door lock 7, which, for example, may be implemented as a rotating metal latch. In a preferred embodiment, coin access door 6 can only be unlocked by a key for door lock 7 that is different from the key for knob lock 11.

FIG. 2*a* illustrates an exemplary mechanism within vending faceplate 100 of FIG. 1*a* to carry out the foregoing principles, in accordance with an embodiment of the present invention. In the Figure, the following elements are shown:
- A faceplate 201 that frames. the entire device.
- A standard size faceplate 203 that attaches over the conventional outlet.
- Hex machine screw 202 that attaches faceplates to the conventional outlet.
- A coin holder 14*a*.
- A coin stopper 14*b*, which stops a coin drive shaft 208 from moving by butting against
- compression arms 214 until a quarter is placed in the coin receptacle.
- Size maintenance member 204, which maintains the size of the quarter position" to "by compression arms 214 compressing 214 until maintenance member 204 returns to its resting position".
- A change fall-out 205, which allows dimes, pennies and nickels to fall through so as to not jam coin holder 14*a*
- A change fall-out rail 206, which directs coins into coin storage area 227.
- A retraction knob 12, which directs coin drive shaft 208 along rails 209 and compresses compression spring 210 thereby pushing 214 outwards compressing a compression chamber 216.
- Coin drive shaft 208, which is connected to retraction knob 12 and a T-connection bar 220, which pull a retraction bar pin 222, a retraction bar rail 223, a retraction bar spring 224, and outlet covers 8 thereby exposing the conventional outlet 16.
- Rails 209, which direct coin drive shaft 208.
- A compression spring 210, which is controlled by coin drive shaft 208.
- A key gear 211, which is controlled by a maintenance key moving key extender arms 212 outward pushing compression arms 214 outward thereby pushing a swivel arm 218 outwards and compressing a compression spring 217, which allows coin drive shaft 208 to slide without inserting coins.
- Key extender arms 212, which is attached to key gear 211 and 218.
- Extender 213, which pivotally rotates as key gear 11 is turned.
- Compression arms 214 are controlled by 218 and pivot on 219 compressing 217 inside 216
- Rails 215, which direct compression arms 214.

Compression chamber 216, which holds compression spring 217.

compression spring 217

Swivel arm 218, which rotates on a pivot point 219.

Pivot point 219

T-connection bar 220 attached to coin drive shaft 208.

Retraction bar 221 connected to T-connection bar 220

Retraction bar pin 222, which slides between 223 compressing 224 on return if plug has been inserted into outlet 16

Retraction bar rail 223

Retraction bar spring 224

Outlet cover directing member 225, which directs outlet covers 8 when a quarter is inserted into coin holder 14a and pulled by retraction knob 12 and when 210 pushes 208 into original position Outlet covers 8, which are made of any suitable material such as hard plastic or rubber.

Coin storage area 227

A coin drop guide 228, which directs coins into coin storage area 227.

Coins 229 (e.g., a dime, quarter, or nickel).

Figure 2B:
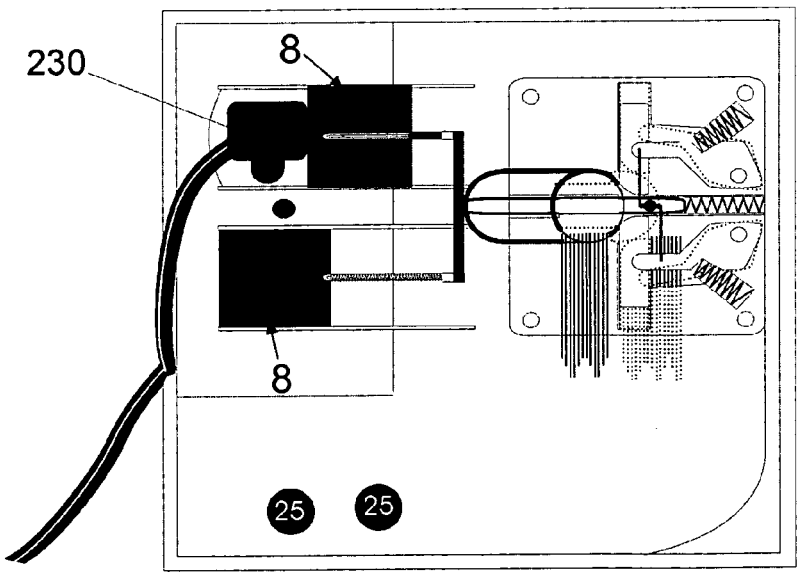

FIG. 2b illustrates is the same embodiment as in FIG. 2a with a conventional electric plug 230 inserted during normal operation, which plug compresses retraction bar spring 224 thereby keeping the upper outlet cover 8 pressing against the side of the electric plug.

The embodiment show in FIG. 2a will now be described in some more operational detail. The dual plates 201 and 203 provide the pockets necessary to protect outlet covers 8. The retraction knob (12) is connected to several other components (208, 211, 220, 221, 222, 224, 8) that make this device functional. Retraction knob (12) may be made of any suitable hard material. Retraction knob (12) slides to the right and returns to the left. Once retraction knob (12) is released, it allows compression spring 210 to spring back to its original position unless a plug is inserted in which case the outlet covers 8 will be tightly sprung against the plug. As soon as plug is removed, the cover is sprung shut over outlet.

Once a coin is deposited into the coin slot (14a; 14b), the retraction knob (12) is able to slide to the right so the coin can be pushed through the compression arms (214) thus extending the key gear (211) and swivel arms (218); and compressing the chamber (216). If the wrong coin denomination is dropped into the coin slot (14a; 14b), then the coin will slide out the bottom or change fall-out (205) down along the coin fall-out rail (206). For example: if the device is designed to take only quarters and someone inserts a dime, then that dime would fall straight into the coin storage (227) without releasing the retraction knob (12) and its corresponding components. This action will be clearly noted in a written warning on the face of vending faceplate 100 (FIG. 1a).

Once the retraction knob (12) is slid and held all the way over to the right, it will expose the outlet for use (outlet resides behind face plate). A plug (1, FIG. 2b) can then be inserted into outlet. When the retraction knob (12) is released without a plug inserted into the outlet, the compression spring (210) pushes the knob (12) and its corresponding components (208, 211, 220, 221, 222, 224, 8) back to their original positions. However, if there is a plug (230) inserted into the outlet (residing behind the faceplate), then the outlet cover (8) is sprung against plug (action illustrated in FIG. 2b). A retraction bar (222) then compresses the retraction bar spring (224) sliding along the retraction bar rail (223). Notice, there are two separate retraction bars, springs, rails, and outlet covers (222–226) which allows them to work independently of one another as illustrated in FIG. 2b. The reason for this action is if one outlet is in use, then another customer who also needs to obtain an outlet will also have to deposit money to open the other outlet cover (8); therefore, NO FREE USAGE. The compression of the retraction bar spring (224) allows the outlet cover (8) to return to its original position (covered outlet) once the plug is removed. The retraction knob (12), and its related components (208, 211, 220, 221, 222, 224, 8) all slide along rails 209, 215, and 225 to keep everything in line. When the appropriate coin is inserted, the retraction knob (12) and its corresponding components (208,211,220,221,224,8) are then moved forward, the coin will arrive at fall-out rails (206, FIG. 2a) where it will drop onto the coin guide (228) directing the coin into the coin storage (227).

The coin stopper (14b) is designed not to move until the appropriate coin is inserted. It is butted up tightly against compression arms (214). Only the appropriate coin size will provide the arch needed to begin the sliding process of the retraction knob (12) and its corresponding components (208, 211, 220, 221, 222, 224, 8). The pivot point (219) allows the rotating arms (218) to swivel when the retraction knob (12) and its related components (208, 211, 220, 221, 222, 224, 8) move. To adapt a convention electrical utility outlet according to the present invention, one simply removes the existing conventional faceplate and replaces it with the present vending faceplate, securing it with hex screws.

Those skilled in the art will appreciate that faceplate frame (FIG. 2a) may be made of multiple types of material including, but not limited to, metal, rubber, plastic, etc. Moreover, coin receptacle 14 of FIG. 1a may be configured in any suitable manner consistent with the foregoing principles. In some embodiments, the coin receptacle will be configured to accept a single coin, or up to 4 coins. The coin receptacle may also be configured to properly handle multiple currencies.

It should be further appreciated that the outlet cover shown may be readily configured to cover a multiplicity of alternate types of utility outlets, including, but not limited to, power, phone, Internet, etc. The utility outlet covers of the present invention may be constructed using any suitable material including plastic, metal, and/or rubber. Attendant to the present utility outlet covers is a safety aspect, which is particular important in locations where children have access to the utility outlets. For example, when an electrical utility outlet adapted according to the present invention is not being used, the idle utility outlet is covered, whereby a young child cannot place his/her finger or metal object in it. The present invention also tends to reduce the frivolous use of power, at least because vending faceplate 100 will secure a utility outlet by allowing access to the outlet via key and currency only.

Figure 3:
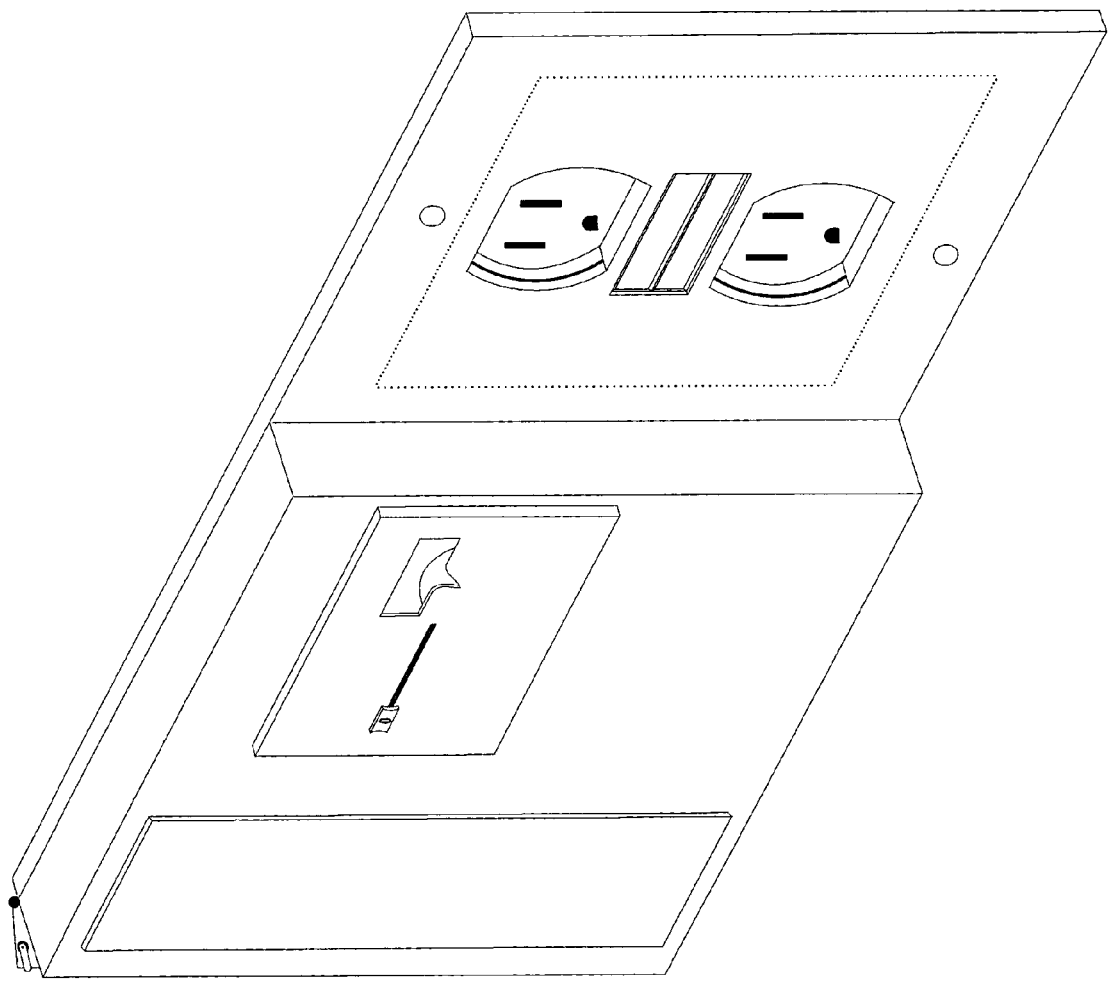
FIG. 3 illustrates a second embodiment of the present invention that is mounted horizontally instead of vertically.

FIG. 3 illustrates a second embodiment of the present invention that is mounted horizontally instead of vertically. This configuration allows access to the safety testing buttons on the outlet itself while accomplishing the vending of power. There could be other configurations such as an over under for tight places as well as a double to cover quad outlets.

The present vending faceplate may be used with any type of utility outlet or utility jack configuration. Embodiments of the present invention are suitable for a multiplicity of applications desiring control, especially profitable control, of publicly accessible utility outlets. Typical consumers contemplated include entities including airports, convention centers, KOA, libraries, universities, high schools, motels, and other public or commercial locations. Such facilities need to secure outlets (power, phone Internet, etc.) so unauthorized users (e.g., travelers) cannot take advantage of the utility outlets for personal use without paying.

By way of example and not limitation, and exemplary application of an embodiment of the present invention shall be set forth as follows. All airports have exposed outlets that the general-public or passengers may use without permission. Because of this situation, most airports may have to pay, sometimes, at least $7,500 per year in additional electrical use by passengers without the ability to recoup these costs. If an airport losing $7,500 a year implements the present vending electrical faceplate, it could generate $144 K of revenue in certain cases. What follows is a scenario of how this process works according to an embodiment of the present invention:

---

Passenger arrives at the gate
Finds all outlets are adapted with the present vending faceplate installed
Passenger has to place at least $.25 into the present faceplate coin receptacle
Passenger then slides the retraction knob to expose the utility outlet
While still holding the knob, passenger then plugs into power outlet
As knob is released, the outlet that is not in use is covered again
While working, the passenger will also notice the advertisement on the present vending faceplate
Once passenger is done and removes plug from outlet, the cover quickly springs back into place covering outlet.
If maintenance/janitorial needs to access the present vending faceplate, they simply insert Key 1 into the knob sliding the knob exposing the outlet
The person responsible for collecting coins will insert Key 2 allowing hinge door to release coins from coin storage area.

---

Having fully described at least one embodiment of the present invention, other equivalent or alternative methods of controlling the unauthorized access to publicly available utility outlets according to the present invention will be apparent to those skilled in the art. The invention has been described above by way of illustration, and the specific embodiments disclosed are not intended to limit the invention to the particular forms disclosed. For example, the particular implementation of the money receiving and outlet-cover control mechanism may vary depending upon the particular application. Moreover, the embodiments described in the foregoing were directed to implementations requiring currency payment or a key to access the controlled utility outlet; however, alternative embodiments may only require payment or key access, but not both. Furthermore, electronic, electromechanical, or other types of known utility outlet blocking means according or keyed access control (e.g., digital/electronic/wireless locks instead of mechanical ones) to the principles of the present invention are contemplated as within the scope of the present invention. The invention is thus to cover all modifications, equivalents, and alternatives falling within the spirit and scope of the following claims.

What is claimed is:

1. A device for utility outlet control, the device comprising:
    means for selectively blocking access to a utility outlet;
    means for disengaging said outlet blocking means;
    means for engaging said outlet blocking means, wherein said outlet blocking engagement means block access to the outlet when the outlet is not being accessed; and
    means for receiving a payment to gain access to the outlet, which payment receiving means cooperates with said outlet blocking disengagement means to make the outlet accessible after receiving the payment.

2. The utility outlet control device of claim 1 further comprising a keyed access mechanism that cooperates with said outlet blocking disengagement means to make the outlet accessible without requiring payment.

3. The utility outlet control device of claim 1 further comprising a keyed access mechanism that cooperates with said payment receiving means to make payments collected accessible to an authorized personnel.

4. The utility outlet control device of claim 1 wherein the utility outlet is an electric utility outlet.

5. The utility outlet control device of claim 1 wherein the payment is by way of coined currency.

* * * * *